United States Patent [19]

Maeding

[11] 4,104,543
[45] Aug. 1, 1978

[54] MULTICHANNEL CCD SIGNAL SUBTRACTION SYSTEM

[75] Inventor: Dale G. Maeding, Carlsbad, Calif.

[73] Assignee: Hughes Aircraft Company, Culver City, Calif.

[21] Appl. No.: 770,556

[22] Filed: Feb. 22, 1977

[51] Int. Cl.² .................... G11C 19/28; H01L 29/78
[52] U.S. Cl. .................... 307/221 D; 357/24
[58] Field of Search .......... 357/24; 307/221 D, 221 C

[56] References Cited

U.S. PATENT DOCUMENTS

| 3,623,132 | 11/1971 | Green | 357/24 |
|---|---|---|---|
| 3,656,011 | 4/1972 | Weinberg | 357/24 |
| 3,801,883 | 4/1974 | Tiemann | 357/24 |
| 4,004,157 | 1/1977 | Baertsch et al. | 357/24 |
| 4,032,767 | 6/1977 | Lagnado | 357/24 |

FOREIGN PATENT DOCUMENTS 2,403,190  8/1974  Fed. Rep. of Germany ............. 357/24

OTHER PUBLICATIONS

Engeler et al., "The Surface-Charge Transistor", IEEE Trans. Electron Devices, vol. ED-18 (12/71), pp. 1125-2236.

Melen et al., "One-Phase CCD: A New Approach to Charge-Coupled Device Clocking", IEEE J. Solid-State Circuits, vol. SC-7(2/72), pp. 92-93.

*Primary Examiner*—William D. Larkins
*Assistant Examiner*—Gene M. Munson
*Attorney, Agent, or Firm*—W. H. MacAllister; Joseph E. Szabo

[57] ABSTRACT

Signal charges in two charge coupled device (CCD) registers are subtracted one from the other by alternately passing them under a common, periodically clamped, normally floating sensing electrode. During those periods when the electrode is clamped, charge is shifted from the subtrahend register to the substrate region underlying the sensing electrode and charge, which has been shifted there previously from the minuend register, is shifted out of that region. During the intervening time periods, when the sensing electrode floats, the process is reversed, with charge from the minuend register being shifted under the sensing electrode and charge previously shifted there from the subtrahend register being shifted out. The resulting voltage reached by the sensing electrode during its floating intervals represents the difference between the charges in the two registers.

6 Claims, 14 Drawing Figures

MULTICHANNEL CCD SIGNAL SUBTRACTION SYSTEM

BACKGROUND OF THE INVENTION

The present invention relates to charge coupled devices (CCD) and in particular to the use of such devices for subtracting one signal from another.

One of the applications of charge coupled devices has been as registers for processing signals in an analog-to-digital or digital-to-analog converter. Typically in such a converter an analog signal is converted into its digital representation by successively comparing it with a reference signal. Heretofore, it has been necessary to perform the comparison by means of a differential amplifier external to the CCD devices.

In an application filed by Paul R. Prince on Sept. 15, 1976, Ser. No. 723,356, assigned to the assignee of the present invention, there is disclosed and claimed a circuit which is integrated as part of a CCD register which is capable of subtracting adjacent charges being propagated along that register.

It is an object of the present invention to sense the difference between the charges in two or more CCD registers directly, without using an external differential amplifier.

A related object of the present invention is to make possible an improved CCD analog-to-digital converter in which the function of subtracting a reference voltage from a signal voltage is performed by CCD registers without the use of an external differential amplifier.

A further object of the present invention is to compare the signals of two or more CCD registers by means of a circuit whose principal sensing element is incorporated in those registers.

These and other object of the invention are attained by a signal subtracting system comprising a semiconducting substrate in which there are formed at least first and second charge transfer channels. Respective sets of charge transfer electrodes extend over the charge transfer channels, with a normally floating sensing electrode structure extending over all of the channels. Clocking signals in the form of pulse trains are applied to the respective sets of charge transfer electrodes, with those channels whose signals are to be added being clocked out-of-phase with those channels whose signals are to be subtracted, so as to alternately shift charge packets from the first group of channels and the second group of channels to and from the substrate region which underlies the sensing electrode structure. A source of switched clamping voltage is connected to the sensing electrode structure and is timed to clamp it each time a charge packet is shifted from one of the groups of channels to the substrate region underlying the floating electrode structure and so as to allow the sensing electrode structure to float when a charge packet is shifted under it from the other group of channels. The difference between the charges in the first group of channels and the second group of channels is detected by detecting the voltage assumed by the sensing electrode structure when it is not clamped.

The present invention also resides in the method of subtracting a first signal from a second signal by generating first and second pulse trains corresponding to the amplitudes of those signals, providing in a semiconducting substrate at least first and second individual charge flow channels, extending an equipotential electrode structure over both of the channels, alternately clamping and floating the electrode, alternately stepping first and second trains of charge packets corresponding to the first and second pulse trains along the first and second charge flow paths respectively, into and out of the substrate region under the equipotential electrode structure, so that each time the electrode structure is clamped, charge is shifted under it from one of the channels and each time it floats a charge is shifted under it from the other of the channels, and detecting the potential of the electrode structure when it floats.

The invention will become apparent in light of the following detailed description taken in conjunction with the accompanying drawings, wherein.

Figure 1:
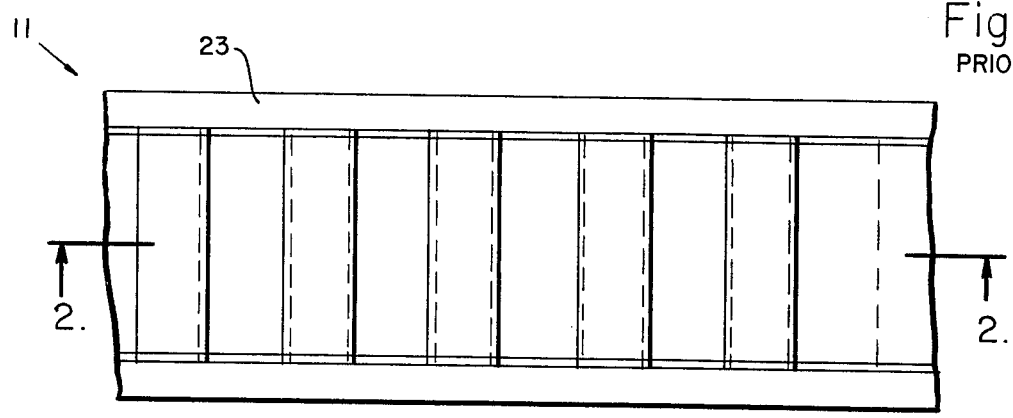
FIG. 1 is a partial plan view of a single channel signal subtraction circuit disclosed in the above-referenced patent application.
Figure 2:
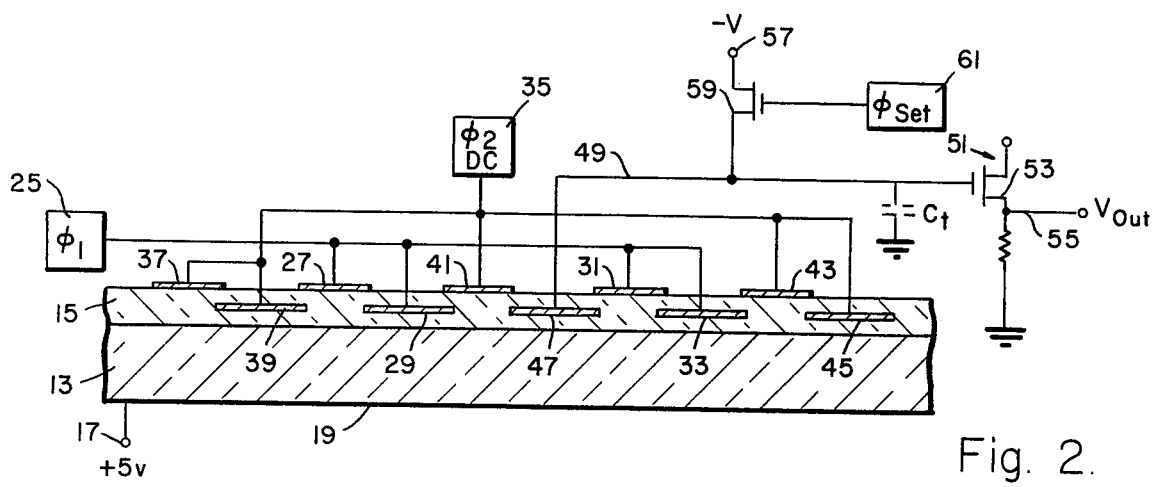
FIG. 2 is a schematic diagram of a circuit incorporating the single channel device of FIG. 1.
Figure 3A:
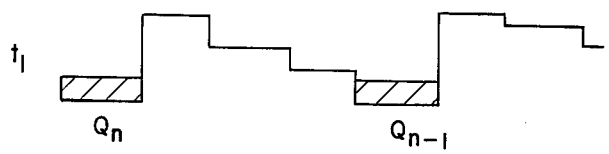
Figure 3B:
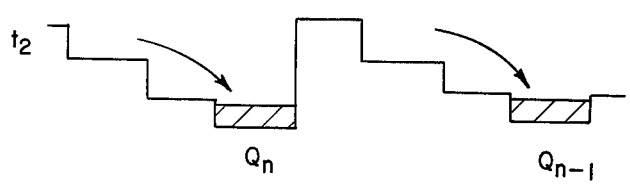
Figure 3C:
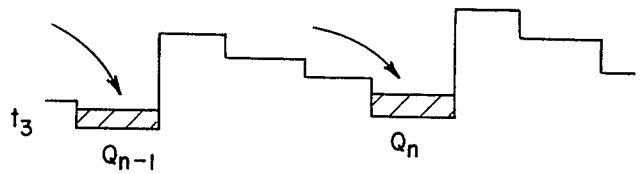
Figure 4:
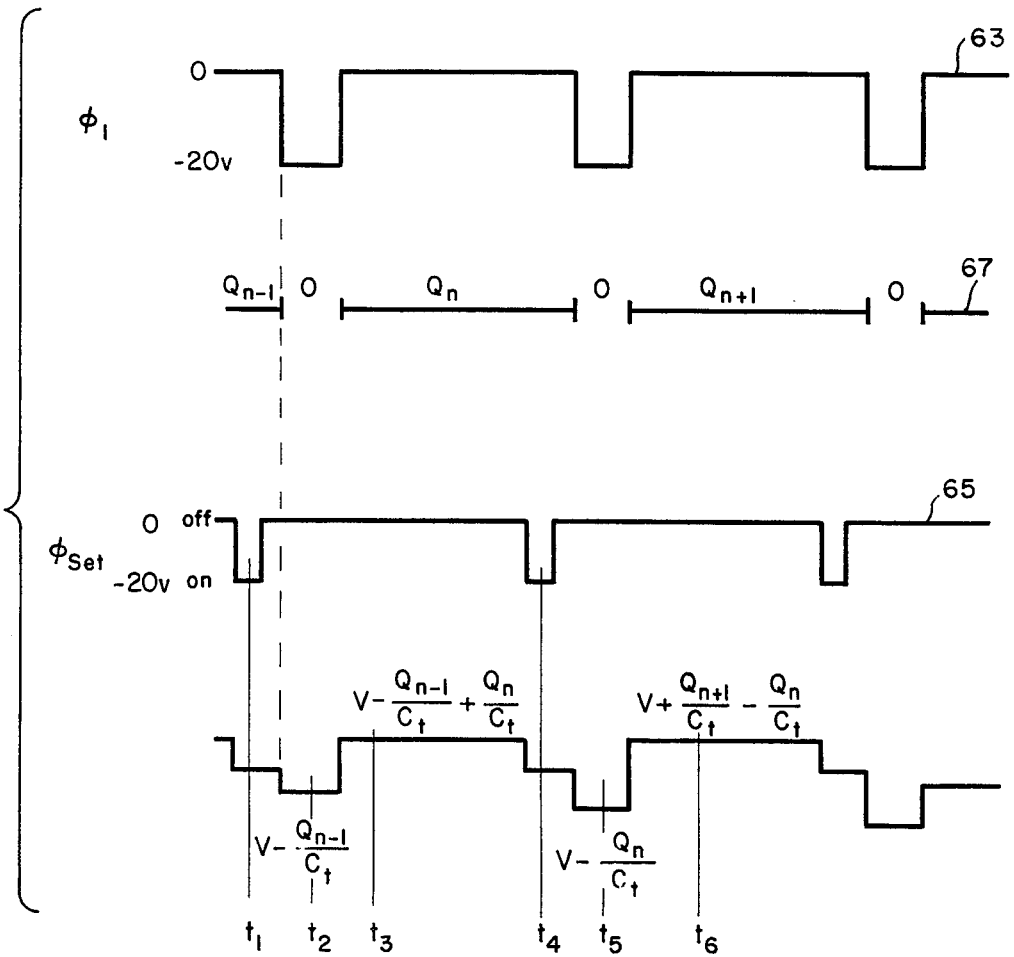
Figure 5:
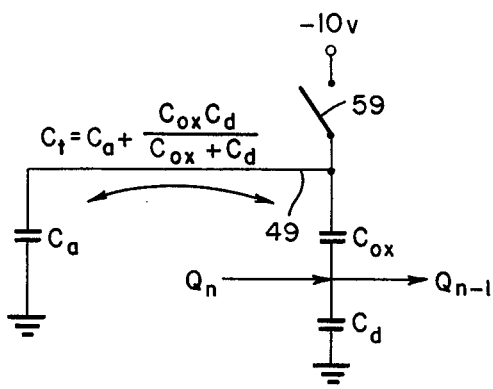
Figure 6:
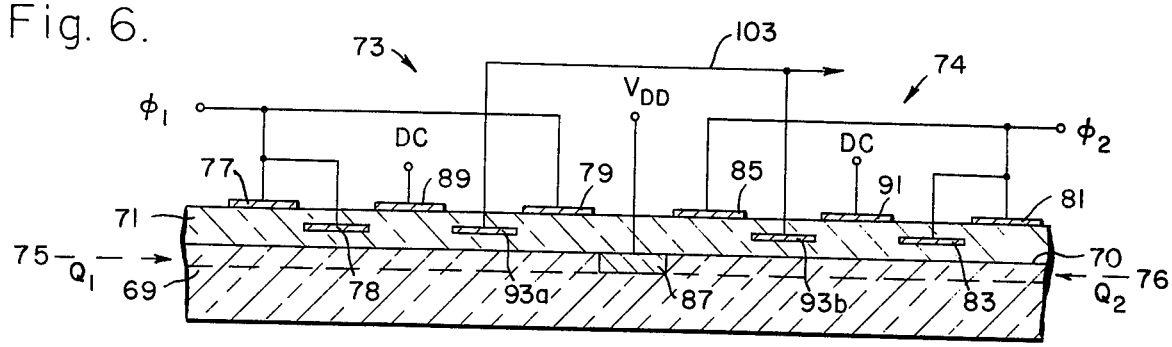
Figure 7:
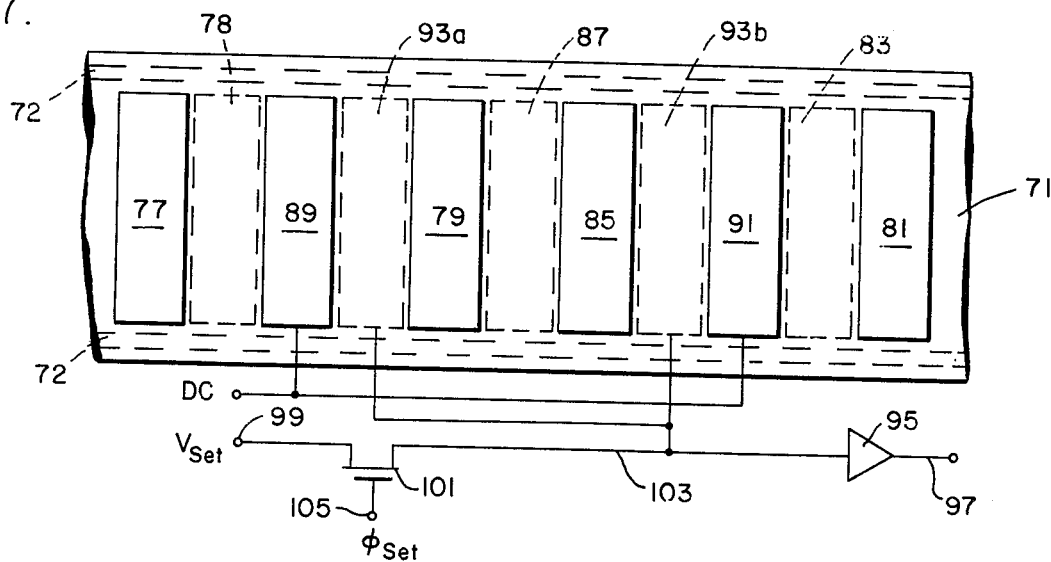
Figure 8A:
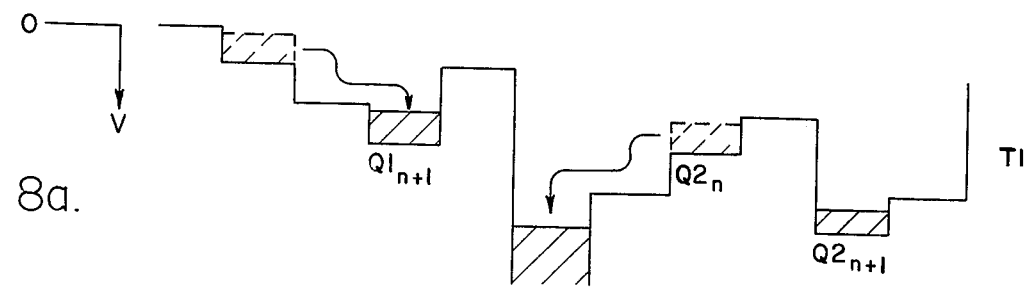
Figure 8B:
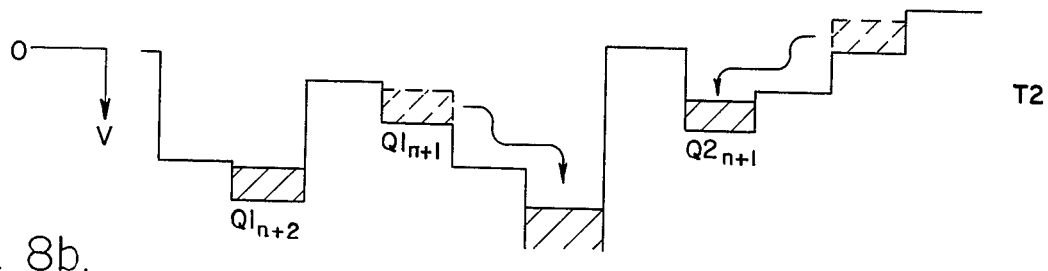
Figure 9:
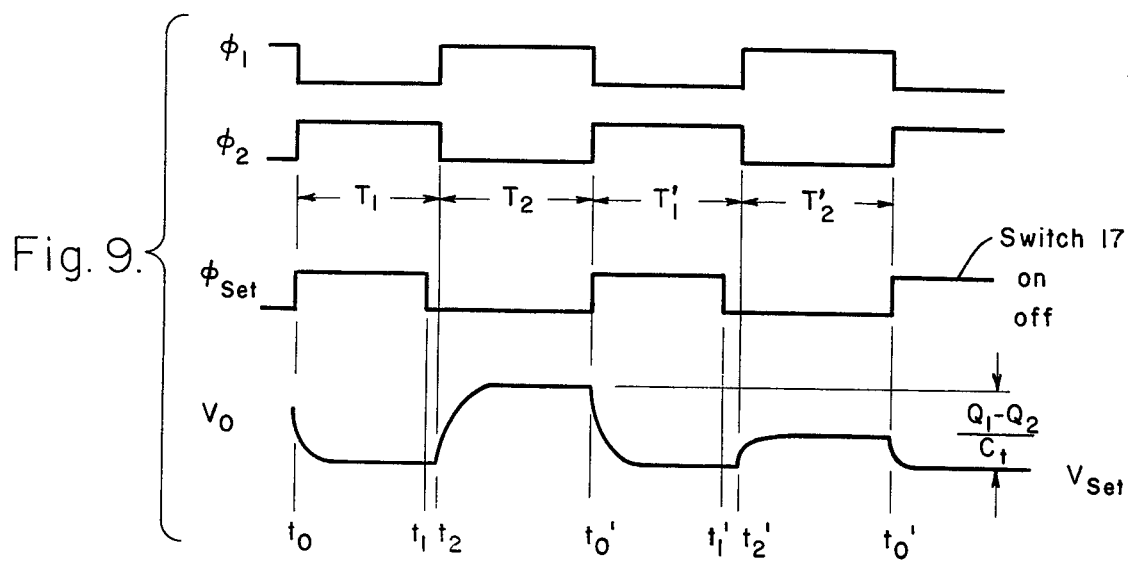
Figure 10:
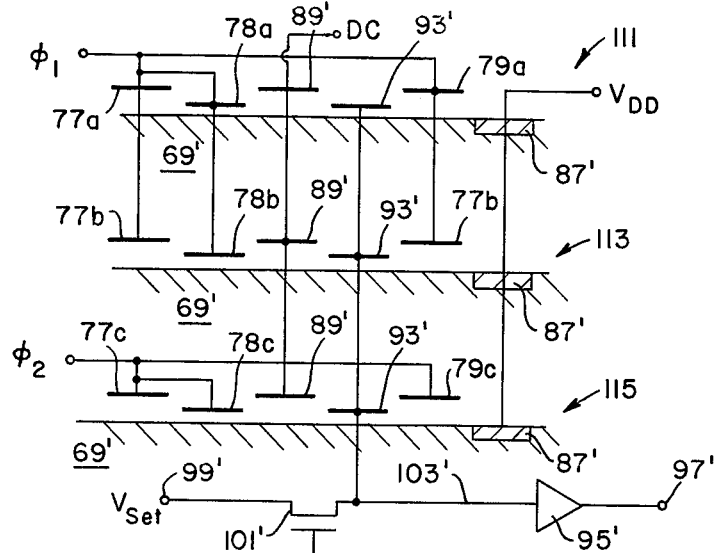
Figure 11:
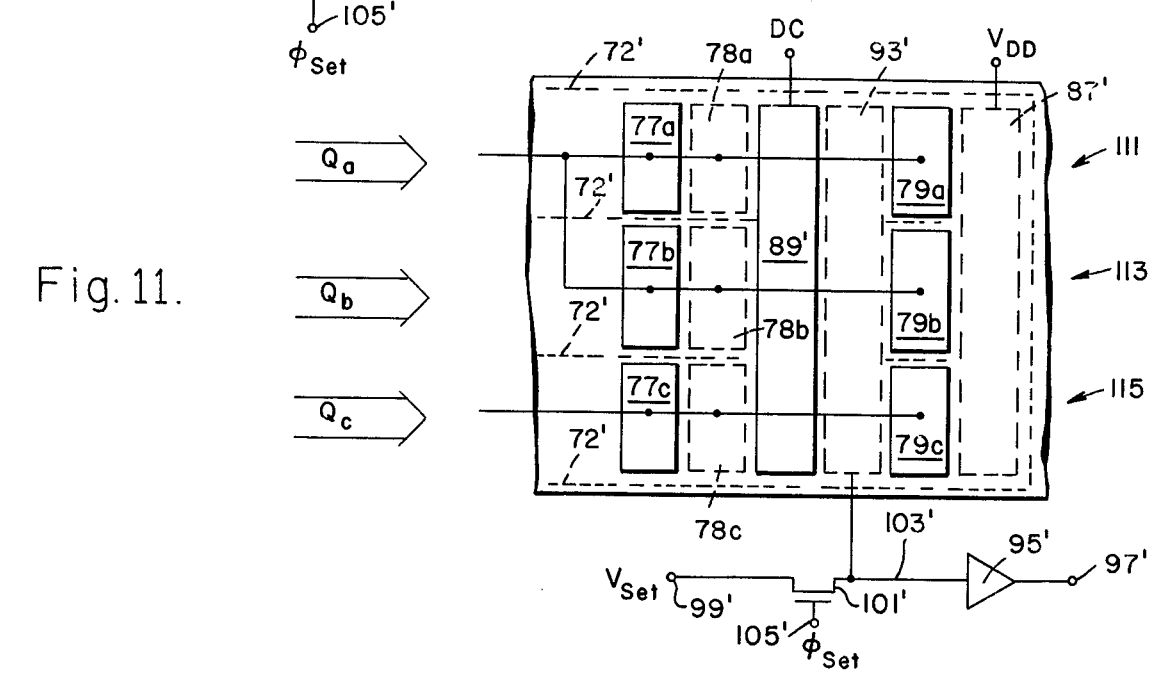

FIGS. 3a, 3b, and 3c are voltage potential profiles showing the location of charge propagated along the CCD device of FIGS. 1 and 2 at three successive time periods;

FIG. 4 illustrates the waveforms of voltages applied to, and detected in, the CCD illustrated in FIGS. 1 and 2;

FIG. 5 illustrates the equivalent circuit of the circuit shown in FIG. 2;

FIG. 6 is a schematic diagram of a system incorporating the multichannel CCD voltage subtractor of the present invention;

FIG. 7 is a plan view of the multichannel CCD schematically illustrated in FIG. 6;

FIGS. 8a and 8b are potential profiles along the CCD illustrated in FIGS. 6 and 7 during alternate time periods to illustrate the timing of charges from a pair of channels past a sensing electrode;

FIG. 9 is a timing diagram illustrating voltages applied to and sensed from the multichannel CCD circuit of FIGS. 6 and 7;

FIG. 10 is a schematic illustration of a voltage subtracting circuit comprising more than two channels, but otherwise essentially similar to the system illustrated in FIGS. 6 and 7; and FIG. 11 is a plan view of the device schematically illustrated in FIG. 10.

DETAILED DESCRIPTION OF PREFERRED EMBODIMENTS

In order to help understand the present invention, there will first be briefly described with reference to FIGS. 1-5 the single channel CCD subtractor disclosed in the above-referenced patent application of Paul R. Prince.

The subtractor of FIGS. 1-5 is formed in a semiconductor substrate 13 having a thin layer of oxide deposited on its top. Buried in the oxide layer 15, and distributed along its surface, are electrodes through which potentials are applied to move charges from left to right, from one potential well to the next. With the semiconductor material having an N-type conductivity as illustrated, a +5 volt reference potential would typically be applied from a source 17 to a conducting layer 19 at the bottom of the substrate. Charges are entered into the channel by suitable circuitry and are injected into the semiconductor substrate through a P+ diffusion region (not shown). Injected charges are confined within a channel formed in the substrate by a pair of N+ channel stops 23. A $\phi_1$ clocking signal from a suitable source 25 is applied to electrodes 27, 29, 31 and 33 and a $\phi_2$ DC signal is applied from a second appropriate source 35 to electrodes 37, 39, 41, 43 and 45.

A normally floating sensing electrode 47, utilized for readout, is coupled through a lead 49 to a source follower circuit 51, shown as an FET 53, with the lead 49 being coupled to the control electrode, and with the other electrodes being coupled between suitable sources of potential and current to provide a signal $V_{out}$ to an output lead 55. A clamping voltage $-V$ is applied from a source 57 through a switching FET 59 to the lead 49 in order to permit a reference voltage to be applied to the sensing gate 47 periodically. The timing of the switching FET 59 is controlled from a $\phi_{set}$ source 61, which clamps the sensing electrode 47 in the presence of the first charge of the subtraction process in a well under the sensing electrode.

The capacitance associated with the elements which are connected to lead 49 is shown by a dotted capacitor $C_t$ and includes the capacitance of the amplifier and stray capacitances $C_A$, the series capacitance of the oxide $C_{ox}$ and the voltage dependent depletion capacitance $C_d$, both associated with the sensing electrode 47. An equivalent circuit of the sensing electrode 47, the aforementioned capacitances, and the switching FET 59 is shown in FIG. 5. As revealed by that equivalent circuit, during the operation of the system of FIGS. 1 and 2, the alternate opening and closing of the switching FET 59 alternately clamps and unclamps a capacitance $C_t$ whose total value is $C_A + C_{ox} \cdot C_d/C_{ox} + C_d$. Referring now also to FIG. 4, $\phi_1$, represented by the waveform 63, operates in conjunction with $\phi_{set}$, shown as the waveform 65, and the $\phi_2$ DC signal to move charges along the channel of the CCD 11. At a time $t_1$ a signal charge $Q_{n-1}$, shown along a line of charges 67, is in the potential well under the sensing electrode 47, as shown in FIG. 3a, and the $\phi_{set}$ pulse of the waveform 65 is applied to the gate of switching FET 59 to establish the surface potential of the charge $Q_{n-1}$ in addition to establishing the potential well. When the $\phi_{set}$ pulse of the waveform 65 returns to its off potential, prior to the pulse of the waveform 63, the lead 49 is in a floating condition and the capacitance $C_t$ assumes the charge $V.C_t$. At a time $t_2$ the $\phi_1$ pulse of the waveform 63 is applied to the electrodes 37, 39, 41, 43 and 45 and the charge $Q_{n-1}$ is transferred to a subsequent well, as shown in FIG. 3b.

Since a charge $Q_{n-1}$ is transferred from beneath the sensing electrode 47, the voltage on line 41 drops in proportion to that charge. Thus, at time $t_2$ the voltage on lead 49, indicated as $V_{44}$ in FIG. 4, is $V - [(Q_{n-1})/C_t]$. When the $\phi_1$ pulse of the waveform 63 is terminated, charge $Q_n$ is shifted into the well under the sensing electrode 47. At time $t_3$, as shown in FIG. 3c, the voltage across the capacitance $C_t$, as measured on line 49, is increased in proportion to the charge gained by it and becomes $V - (Q_{n-1}/C_t) + Q_n/C_t$, a difference signal which may be read out during the period bracketed in FIG. 4. Similarly, at time $t_4$, with the charge $Q_n$ in the potential well under the sensing electrode 47, the $\phi_{set}$ pulse of the waveform 65 is applied to establish the surface potential in the presence of the charge $Q_n$ under sensing electrode 47 and in response thereto a voltage $-Q_n/C_t$ is stored in the capacitance $C_t$. In response to $\phi_1$ of the waveform 63 at time $t_5$, the charge $Q_n$ is removed from the potential well under the electrode 47 and, at time $t_6$, the charge $Q_{n+1}/C_t$ is transferred to that well, with the readout voltage being $V + (Q_{n+1}/C_t) -$ $Q_n/C_t$. Thus, with the CCD channel structure of FIGS. 1 and 2, adjacent signals may be subtracted without a differential amplifier.

In accordance with the present invention, the basic concept described with reference to FIGS. 1–5 is extended and applied to the algebraic summing, or subtracting, of charges in two or more CCD's. This is accomplished by incorporating a unipotential, normally floating sensing electrode in two or more CCD's. Thus, assuming that it is desired to subtract the output of CCD #2 from that of CCD #1, the output charge from the first CCD is shifted under the sensing electrode during those intermittent periods when that electrode is permitted to float and, at the same time, charge which had been shifted under the gate during the preceding time period is shifted out from under it. During alternate time periods when the sensing electrode is clamped, the reverse takes place, with charge from the first CCD being shifted out from under the sensing electrode and charge from the second CCD being shifted under it. The effect is to shift the potential of the sensing electrode by an amount proportional to the difference between the pair of charges which were successively shifted from alternate ones of the two CCD's under the sensing electrode.

Referring now to FIGS. 6–11 for a more detailed understanding and description of the present invention, the first preferred embodiment of the present invention comprises two CCD registers 73 and 74 formed in a semiconductor substrate 69 on whose surface 70 a thin oxide layer 71 has been formed. Charge carrying channels 75 and 76, for the CCD registers 73 and 74 respectively, are defined in the substrate by $N+$ channel stopper regions 72. Charge packets, identified as $Q_1$ and $Q_2$ in FIG. 7, flow from opposite ends of the system toward its center in the respective CCD registers 73 and 74 inside the channels 75 and 76 toward a common drain region 87 which is maintained at a reference potential $V_{dd}$. Buried in the oxide layer 71 and distributed along its surface are two sets of electrodes, one set for each of the CCD's 73 and 74, through which potentials are applied to move charges from opposite ends of the system toward the drain region 87. With the semiconductor material having an N-type conductivity as illustrated, the drain region 87 will be a $P+$ type diffusion, with a +5 volt reference potential being typically applied from a suitable source to a conducting layer at the bottom of the substrate 69 (not shown) and with the reference potential $V_{dd}$ of the drain region 87 being maintained at $-15$ volts.

The charges $Q_1$ and $Q_2$ are entered into the channels 75 and 76 by suitable circuitry and may be injected in a manner similar to that illustrated in FIG. 1, through a $P+$ diffusion (not shown). The electrodes 77, 78 and 79 of the first CCD 73 receive a $\phi_1$ clocking signal, and a $\phi_2$ clocking signal is applied to the electrodes 81, 83 and 85 of the second CCD 74. Located next to respective ones of the $\phi_1$ and $\phi_2$ electrodes 78 and 83 are electrodes 89 and 91 maintained at a DC potential. Finally, a first sensing electrode member 93a is disposed in the channel 75 between the electrodes 89 and 79 and a second sensing electrode member 93b is located in the channel 76 between its electrodes 85 and 91. The two sensing electrode members 93a and 93b are electrically interconnected so as to always be at a common potential and may be thought of as a single sensing electrode structure 93. Over a line 103 the sensing electrode structure 93 is connected to an input of an amplifier 95 which may be a source follower FET such as that identified by the reference numeral 53 in FIG. 2. A clamping voltage $V_{set}$ is applied periodically to the sensing electrode structure 93 over the line 103 through a switching FET 101 whose gate electrode is controlled by a $\phi_{set}$ signal from a source 105.

The capacitances associated with the elements which are connected to the lead 103 can be identified by again referring to FIG. 5, it being understood that the capacitances $C_{ox}$ and $C_d$ refer to the oxide capacitance and the depletion capacitance of both members 93a and 93b of the sensing electrode structure 93.

FIG. 9 illustrates the clocking signals $\phi_1$ and $\phi_2$, the control signal $\phi_{set}$, and the resulting voltage $V_o$ which will appear at the output 97 of the amplifier 95.

In the following paragraphs several cycles of operation of the circuit of FIGS. 6 and 7 will be described with reference to FIGS. 5, 8a, 8b and 9, beginning arbitrarily with the instant $t_o$ indicated at FIG. 9. At that instant the $\phi_1$ clocking voltage has just gone low (a less negative voltage), the $\phi_2$ clocking voltage has just gone high (a more negative voltage), and the $\phi_{set}$ control voltage has also gone high. As a result of $\phi_{set}$ going high, the switching FET 101 is turned on and the voltage $V_{set}$ is applied through it to the sensing electrode structure 93. The potentials of the DC level imposed on the electrode 91 and the $V_{set}$ potential imposed on the sensing electrode structure 93 are selected so that a continuously descending staircase potential gradient is established from under the DC biased electrode 91 to the drain region 87, as depicted in FIG. 8a. This causes the charge packet $Q2_n$, which had last resided under the sensing electrode member 93b, to be dumped into the drain region 87. Similarly, because of the voltage levels applied to the electrodes 78, 89 and 93a, a continuously descending staircase potential gradient is established under those electrodes in CCD 73, with a voltage gradient minimum being established under the sensing electrode member 93a. Consequently, the charge packet $Q1_{n+1}$ which, prior to the instant $t_o$, had resided under the electrode 78, is shifted to the potential well established under the sensing electrode member 93a. In short, beginning with the instant $t_o$ and ending some time during the time period $T_1$ (see FIG. 9), there has been deposited under the sensing electrode member 93a an amount of charge $Q1_{n+1}$ while an amount of charge $Q2_n$ has been removed from under the sensing electrode member 93b.

Notwithstanding the foregoing shifts of charge during the time period $T_1$, the voltage level of the sensing electrode structure 93 is not affected because it is tied during that time period to the reference potential $V_{set}$. Instead, commencing with the beginning of the time period $T_1$ the voltage applied to the input of the amplifier 95 is rapidly pulled to and is held at the reference potential $V_{set}$.

Beginning at time $t_1$, the control signal $\phi_{set}$ goes low, causing the switching FET 101 to open the circuit between the sensing electrode 93 and the reference potential $V_{set}$. Consequently, beginning at time $t_1$ the sensing electrode 93 is permitted to float and to assume a potential which is governed by the net charge which is about to be shifted under it. This event begins at time $t_2$, when the clock voltages $\phi_1$ and $\phi_2$ go high and low, respectively. This change in potentials, imposed upon the various electrodes 77, 78, 71, 81, 83 and 85, brings about the potential gradients depicted in FIG. 8b. In particular, a potential gradient minimum is now established under the sensing electrode member 93b, causing the charge packet $Q2_{n+1}$, which during time period $T_1$ had resided in the potential well then under the electrode 83, to shift under the sensing electrode member 93b. Similarly, because of the potential gradient now established in CCD 73, the charge packet $Q1_{n+1}$ which had, during the time period $T_1$ resided under the sensing electrode member 93a, is dumped from under that gate into the drain region 87. In short, during time period $T_2$ there is a net change of charge under the sensing electrode structure 93 corresponding to the loss of charge packet $Q1_{n+1}$ and the gain of the charge packet $Q2_{n+1}$, i.e., $Q2_{n+1} - Q1_{n+1}$.

Since the now floating sensing electrode 93 is permitted to attain whatever voltages are dictated by the charge packets thereunder, this net change of charge serves to shift the potential of the electrode structure 93, and hence the input voltage to the amplifier 95.

The end of time period $T_2$ marks the end of the first full cycle of operation of the circuit illustrated in FIGS. 6 and 7 and marks the beginning of the next cycle, depicted by the time $t'_0$. During the next two time periods $T'_1$ and $T'_2$ the flow of charge packets depicted in FIGS. 8a and 8b, respectively, is repeated so that, during the time period $T'_1$, the charge packet $Q2_{n+1}$ which, during time $T_2$ had been placed under the sensing electrode member 93b will now be dumped into the drain region 87 and the charge $Q1_{n+2}$ which, during time period $T_2$ had been placed under the electrode 78 of CCD 73, will now be shifted under the sensing electrode member 93a. Again, this will not affect the potential of the sensing electrode structure 93 which again will be maintained at the reference or clamping potential $V_{set}$ until the time $t'_1$. Then, shortly thereafter at time $t'_2$, the clocking signals $\phi_1$ and $\phi_2$ again go high and low, respectively, and the conditions illustrated in FIG. 8b are again repeated. Thus, the charge $Q1_{n+2}$ is dumped from under the sensing electrode member 93a into the drain region 87 and a charge $Q2_{n+2}$ (not shown) is shifted under the sensing electrode member 93b, resulting in a net charge change of $Q2_{n+2} - Q1_{n+2}$. This represents the second of the illustrated sensing conditions during which the voltage assumed by the temporarily floating sensing electrode structure 93 is determined by the net change in the charges shifted to and from them.

The manner in which the circuit of FIGS. 6 and 7 accomplish a summing or differencing operation may be understood better by referring to the equivalent circuit of FIG. 5. Each of the sensing electrode members 93a and 93b may be thought of as an MOS capacitor whose upper plate is comprised of the respective electrode members 93a and 93b, whose dielectric is comprised of the portion of the oxide layer 71 between the electrode member 93a or 93b and the substrate surface and whose lower electrode is comprised of the depletion region which is created underneath the electrode member 93a or 93b in the substrate 69. It has been shown, see for example MOS/LSI Design and Application by William N. Carr and Jack P. Mize, Texas Instruments Electronics Series, McGraw-Hill Book Company at pages 38–41, that the MOS capacitor is essentially comprised of two capacitors $C_{ox}$ (the capacitance of the oxide) and $C_d$ (the capacitance of the silicon depletion layer). Thus, in the equivalent circuit of FIG. 5 the MOS capacitor created by the sensing electrode members 93a and 93b and the underlying oxide and silicon is represented by the series connected capacitances $C_{ox}$ and $C_d$. The oxide and depletion capacitances associated with the respective sensing electrode members 93a and 93b may be lumped together, since the two members are interconnected and since the bottom "plates" of the MOS capacitors formed by those electrode members are the same substrate which is connected to a common reference potential (not shown). Completing the equivalent circuit of FIG. 5 is the input capacitance of the amplifier 95 and the stray capacitance of the line 103, which together are identified as $C_a$ and are shown connected in parallel with the series-connected electrode capacitances $C_{ox}$ and $C_d$.

If the switching FET 101 of the FIG. 6, 7 circuit is substituted for the switching FET 59 identified in FIG. 5, one has the equivalent circuit of the FIG. 6, 7 circuit so that the equivalent capacitance which is alternately clamped to a negative voltage and unclamped to float is identified as the total capacitance $C_t$. During the periods $T_1$, $T'_1$, etc., the switching FET 101 is turned on and the voltage across the total capacitance $C_t$ is clamped to the reference potential $V_{set}$.

It is during these periods that a quantity of charge $Q_1$ is deposited from the CCD 73 in the capacitance $C_t$ and a quantity of charge $Q_2$ is removed from that capacitor by means of the CCD 73. As noted, therefore, neither the injection of the charge $Q_1$ nor the removal of the charge $Q_2$ will have any effect upon the amplifier 95 because of the clamping effect of the reference voltage $V_{set}$. On the other hand, during the time periods $T_2$, $T'_2$, etc., the switching FET 101 is turned off and it is during these periods that the charge quantity $Q_2$ is injected into the capacitance $C_t$ and the charge quantity $Q_1$ is removed from that capacitance. This net change of charge in the capacitance $C_p$ representing the net change of charge under the sensing electrode structure 93, is effective to change the potential across the capacitance $C_p$ causing the voltage at the input of the amplifier 95 to change accordingly.

The first exemplary system of FIGS. 6 and 7 is limited to subtracting one signal from another. The principle of the present invention may be extended, however, to subtracting the sum of any number of signals from the sum of any number of additional signals. This principle is illustrated by the second preferred exemplary embodiment shown in FIGS. 10 and 11 in which three charge carrying channels, forming part of three CCD registers 111, 113 and 115, are illustrated. Each of the CCD registers 111, 113 and 115 corresponds to one of the CCD registers of FIGS. 6 and 7 and, for sake of simplicity and ready comparison, elements of the CCD registers shown in FIGS. 10 and 11 which correspond to similar elements of the register 73 of FIGS. 6 and 7 are labeled with the same reference numeral but with the subscript a or b or c added for various elements of the channels associated with the CCD registers 111, 113 and 115. In some instances a single element is shared by all three CCD registers 111, 113, 115, in which event the element is identified with the same reference numeral as the corresponding element of CCD 73 of FIGS. 6 and 7 but with an apostrophe (') added. The input and output voltages associated with the circuits of FIGS. 10 and 11 are identified by the same reference characters as those of FIGS. 6 and 7, since the same clocking and control voltages $\phi_1$, $\phi_2$, $\phi_{set}$ may be used, and similarly the same reference potentials $V_{dd}$ and DC will be found appropriate.

In the device of FIGS. 10 and 11, three individual charge carrying channels A, B and C are defined by a channel stopper 72' for respectively confining charges $Q_A$, $Q_B$ and $Q_C$ within those channels. The functions performed by the minuend registers 111 and 113 are analogous to that performed by CCD register 73 of FIGS. 6 and 7 in that they serve as minuend registers whose signals will be subject to subtraction by a further signal. The third register 115 corresponds in function to the register 74 of FIGS. 6 and 7 in that it serves as a subtrahend register whose signals are subtracted from those processed by the minuend registers 111 and 113. Charges $Q_A$ and $Q_B$ are stepped in tandem along the channels A and B of registers 111 and 113 toward the drain region 87' and are shifted under the sensing electrode structure 93' during those periods when the electrode structure is permitted to float by the switching FET 101'. During those same periods the charge $Q_C$ is stepped along the channel C of the subtrahend register 115 out of step with the charges $Q_A$ and $Q_B$ in the registers 111 and 113 so that the charge $Q_C$ is stepped out from under the sensing electrode 93' during the time periods when the electrode structure floats. Similarly, during those periods when the electrode structure 93' is clamped to the voltage level $V_{set}$, the charges $Q_A$ and $Q_B$ are dumped from under the sensing electrode structure 93' into the drain region 87' and the charge $Q_C$ in CCD 115 is shifted under the sensing electrode structure. It will be noted that, whereas in the two-channel structure of FIGS. 6 and 7 charges converge toward a common center in the channels 75 and 76, in the three-channel device of FIGS. 10 and 11 the channels are disposed parallel to one another so that the charges flow in the same direction toward the common drain region 87'. It is a result of the difference in geometries that in the three-channel device of FIGS. 10 and 11, the sensing electrode structure 93' is comprised of a single electrode spanning all three channels. Electrically it is equivalent to the interconnected electrode members 93a and 93b of FIGS. 6 and 7. It is for this same reason that the DC biased electrodes 89 and 91 of FIGS. 6 and 7 are replaced in FIGS. 10 and 11 by a single electrode 89'.

It should be understood that a two-channel configuration such as that of FIGS. 6 and 7 could be laid out exactly like the three-channel configuration of FIGS. 10 and 11 by simply eliminating the third CCD register 115 and all elements associated therewith. Similarly, it will be seen that a three or more channel device could be laid out in a manner similar to that of FIGS. 6 and 7 that is, by having the minuend channels to one side of the common drain region 87' and the subtrahend channels located on its other side. Moreover, it is by no means necessary to follow the sensing electrode with a diffusion. Instead, the charge could go on to another potential well after being sensed.

What is claimed is:

1. A method of subtracting a first signal from a second signal comprising the steps of:
   (a) providing, in a semiconducting substrate first and second individual charge flow channels, extending first and second sets of charge transfer electrodes over respective ones of said channels, and extending an equipotential electrode structure over both of said channels;
   (b) generating first and second pulse trains corresponding to the amplitudes of said first and second signals and applying said first and second pulse trains respectively to said first and second charge transfer electrodes;
   (c) alternately clamping said electrode structure by connecting said structure to a source of clamping potential and floating said electrode structure by disconnecting said structure from said source of clamping potential;

(d) alternately stepping first and second trains of charge packets corresponding to said first and second pulse trains along said first and second charge flow channels respectively, into and out of the substrate region under said equipotential electrode structure so that each time said electrode structure is clamped, charge is shifted under it from one of said channels and each time it floats, charge is shifted under it from the other of said channels; and (e) detecting the potential of said electrode structure when it floats.

2. A signal subtraction system comprising in combination:

(a) a semiconducting substrate;

(b) first and second individual charge transfer channels in said substrate;

(c) means for injecting first and second individual trains of charge packets into said first and second charge transfer channels;

(d) first and second sets of charge transfer electrodes extending over respective ones of said channels and an unipotential sensing electrode structure extending over both of said channels;

(e) means for intermittently connecting said electrode structure at regular intervals to a source of clamping potential so as to cause said electrode structure alternately to be clamped and floated; and (f) means for generating and applying to selected ones of said first and second sets of charge transfer electrodes, first and second out-of-phase driving pulse trains for steping said first and second trains of charge packets in said first and second channels toward, into and out of the substrate region under said unipotential sensing electrode structure, said pulse trains being so timed with respect to the alternate clamping and floating of said unipotential sensing electrode structure that each time said electrode structure is clamped, charge is shifted under it from one of said channels and each time it floats, charge is shifted under it from the other of said channels.

3. The system of claim 2 characterized further by means for detecting the potential on said sensing electrode structure when it is floating.

4. The system of claim 1 characterized further in that said first and second channels and said first and second sets of electrodes are symmetrical, said sensing electrode structure is interleaved with each of said first and second series of electrodes so that it is bracketed by a pair of electrodes over each said channel, and in that one of said pair of electrodes receives pulses from said pulse generating means while the other pair is maintained at a DC potential.

5. The system of claim 4 characterized further by a drain region next to both of said ones of said pairs of electrodes which bracket said sensing electrode structure over said channels, and a source of reference potential connected to said drain region and in that said first and second sets of electrodes are configured to shift charge along said channels toward said drain in response to the voltage being applied thereto, whereby charge packets are alternately shifted along respective ones of said channels to the substrate underlying said sensing electrode structure and then dumped from that region of the substrate into said drain region.

6. The system of claim 5 characterized further in that said driving pulse trains are timed so as to shift, during a given cyclically recurring time period, from underneath said sensing electrode structure and toward said drain region, the charge which had been shifted under said sensing electrode structure from one of said channels during the preceding cyclically recurring time period and so as to shift, during the same given time period, a charge packet from the other of said channels to the substrate region underlying said sensing electrode means.

* * * * *